(12) United States Patent
Nakagawa et al.

(10) Patent No.: US 6,789,243 B2
(45) Date of Patent: Sep. 7, 2004

(54) INTERACTIVE FLOOR PLANNER APPARATUS FOR CIRCUIT BLOCKS

(75) Inventors: Manabu Nakagawa, Oyama (JP); Junichi Kigoshi, Oyama (JP); Yukihiko Onishi, Oyama (JP)

(73) Assignee: Fujitsu Limited, Kawasaki (JP)

( * ) Notice: Subject to any disclaimer, the term of this patent is extended or adjusted under 35 U.S.C. 154(b) by 129 days.

(21) Appl. No.: 10/307,871

(22) Filed: Dec. 2, 2002

(65) Prior Publication Data
US 2003/0226129 A1 Dec. 4, 2003

(30) Foreign Application Priority Data
May 29, 2002 (JP) ...................................... 2002-154982

(51) Int. Cl.$^7$ .............................................. G06F 17/50
(52) U.S. Cl. ...................... 716/7; 716/1; 716/2; 716/8; 716/10; 716/11
(58) Field of Search ............................. 716/1, 2, 7, 8, 716/10, 11

(56) References Cited
U.S. PATENT DOCUMENTS
5,850,349 A    12/1998   Hirai et al.

2003/0226129 A1 * 12/2003 Nakagawa et al. ........... 716/11

FOREIGN PATENT DOCUMENTS
JP            8-137927            5/1996

* cited by examiner

*Primary Examiner*—Thuan Do
(74) *Attorney, Agent, or Firm*—Katten Muchin Zavis Rosenman

(57) ABSTRACT

The present invention relates to an interactive floor planner apparatus for determining a placement position of functional blocks, in which apparatus functional block information including information on pins and connection information on pin connection between the functional blocks are defined, the apparatus comprising: a functional block shape extracting unit for dividing each of the functional blocks into one or a plurality of divided pieces on the basis of shape of the functional block obtained from the functional block information; an inter-functional block connection calculating unit for calculating a number of connections between pins belonging to divided pieces of two functional blocks connected to each other, between the divided pieces, as a number of connections between the divided pieces on the basis of the connection information; and a ratsnest display unit for displaying the connections between the divided pieces as a combined single line having a line width corresponding to the number of connections between the divided pieces.

8 Claims, 13 Drawing Sheets

FIG.3

```
GROUP1
  (part nameA, pin nameα)
  (part nameB, pin nameβ)
  (part nameC, pin nameγ)
GROUP2
  (IC, 1)
  (C10, 1)
GROUP3
  (IC2, 4)
  (C10, 2)
```

FIG. 4

| part name | location coordinates | | pin name | pin coordinates | | pin information | part symbol | shape name |
|---|---|---|---|---|---|---|---|---|
| C10 | ******* | ******* | 1 | ****** | ****** | | C (capacitor) | PIA****** |
| | | | 2 | ****** | ****** | | | PIA****** |
| C11 | ******* | ******* | 1 | ****** | ****** | | C | PIA****** |
| | | | 2 | ****** | ****** | | | PIA****** |
| C12 | ******* | ******* | 1 | ****** | ****** | | C | PIA****** |
| | | | 2 | ****** | ****** | | | PIA****** |
| IC1 | ******* | ******* | 1 | ****** | ****** | α | — (IC) | PSD****** |
| | | | 2 | ****** | ****** | γ | | |
| | | | 3 | ****** | ****** | β | | |
| | | | 4 | ****** | ****** | | | |
| | | | . | | | | | |
| IC2 | ******* | ******* | 1 | ****** | ****** | β | — | PSQ****** |
| | | | 2 | ****** | ****** | γ | | |
| | | | 3 | ****** | ****** | α | | |
| | | | 4 | ****** | ****** | | | |
| | | | . | | | | | |
| CN1 | ******* | ******* | 1 | ****** | ****** | | CN (connector) | PCZ****** |
| | | | . | | | | | |
| ... | | | | | | | | |

FIG.5

| part name A | connecting position A | part name B | connecting position B | weight | transmission flag |
|---|---|---|---|---|---|
| C10 | center | IC1 | lower | 1 | |
| C10 | center | IC2 | right | 1 | |
| C11 | center | IC1 | lower | 1 | |
| C11 | center | IC2 | right | 1 | |
| C12 | center | IC1 | lower | 1 | |
| C12 | center | IC2 | right | 1 | |
| IC1 | lower | IC2 | right | 3 | 1 |
| CN1 | division 1 | ... | ... | . | . |
| CN1 | division n | ... | ... | . | . |
| ... | | | | | |

FIG.6

[ratsnest display]
 functional blocks
 functional block divisions
 part pins
[conditions]   (setting)
[display/no display]
 number of nets
small |▼————| large

   divided into one piece : central point of the part is set as origin.

FIG.7B

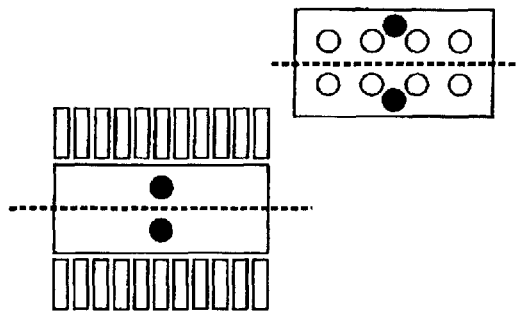

divided into two pieces : divided into upper and lower piece with center of the part as origin.

FIG.7C

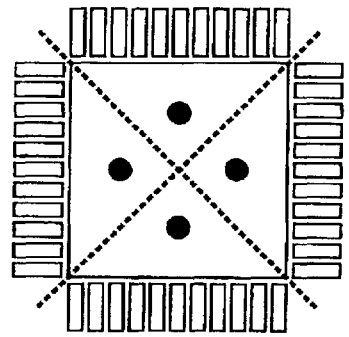

divided into four pieces : divided into upper, lower, right, and left piece with central point of the part as origin.

FIG.7D

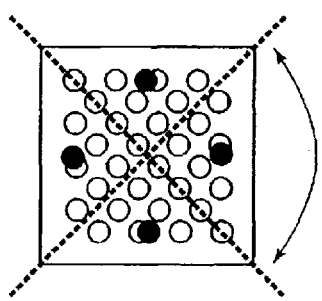

the part is considered to be rectangle, and is divided along diagonal lines.

divided into four pieces : divided by angle with central point of the part as origin.

FIG.7E

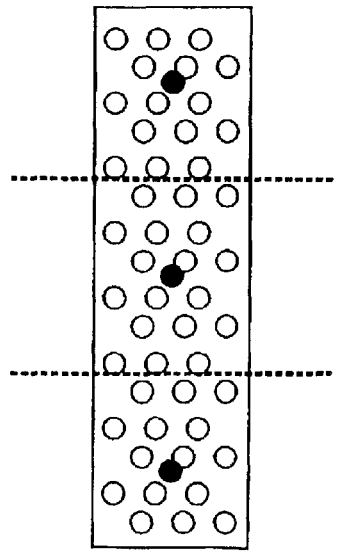

divided into n pieces : long sides of the part are divided into n equal parts.

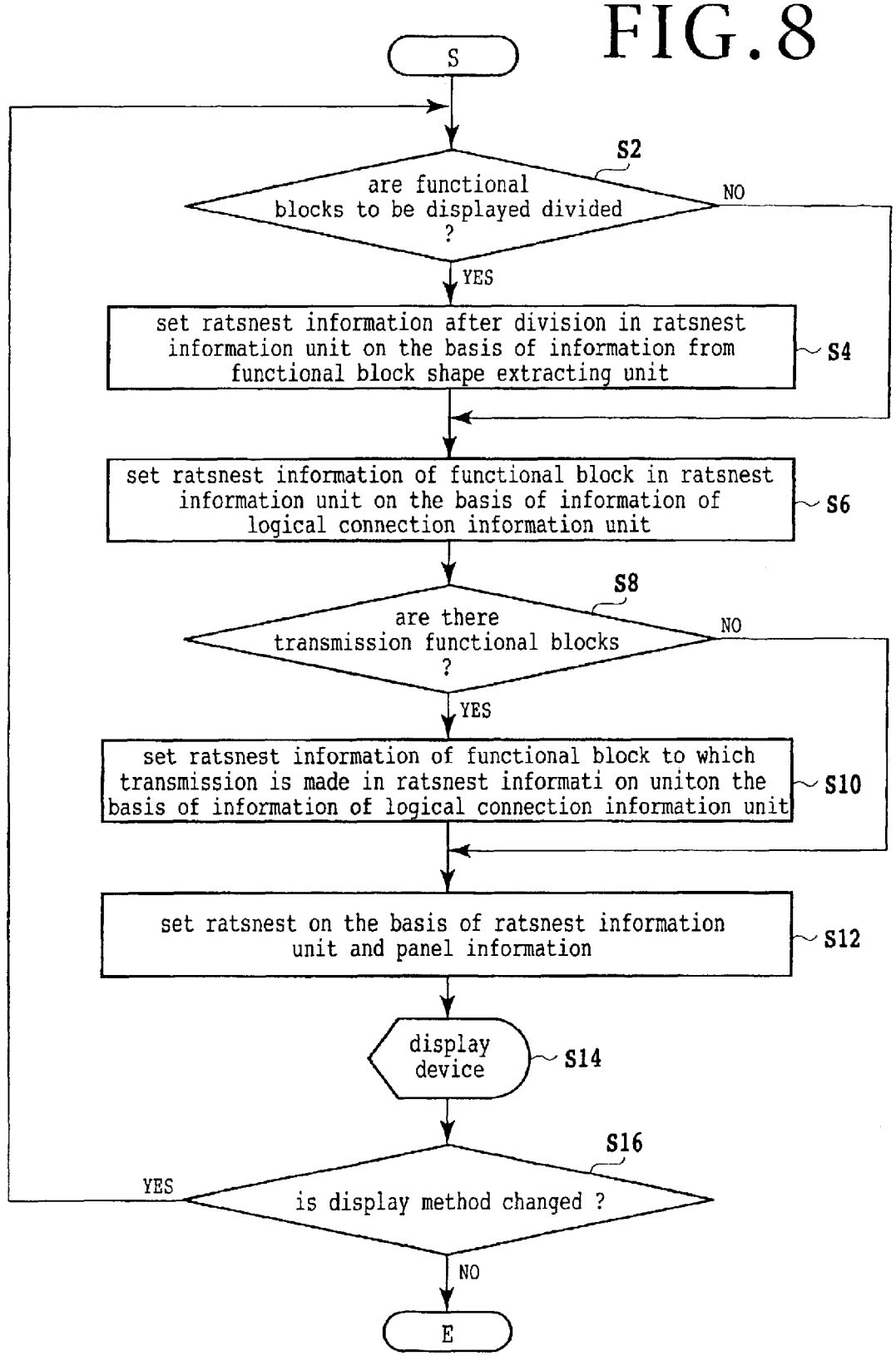

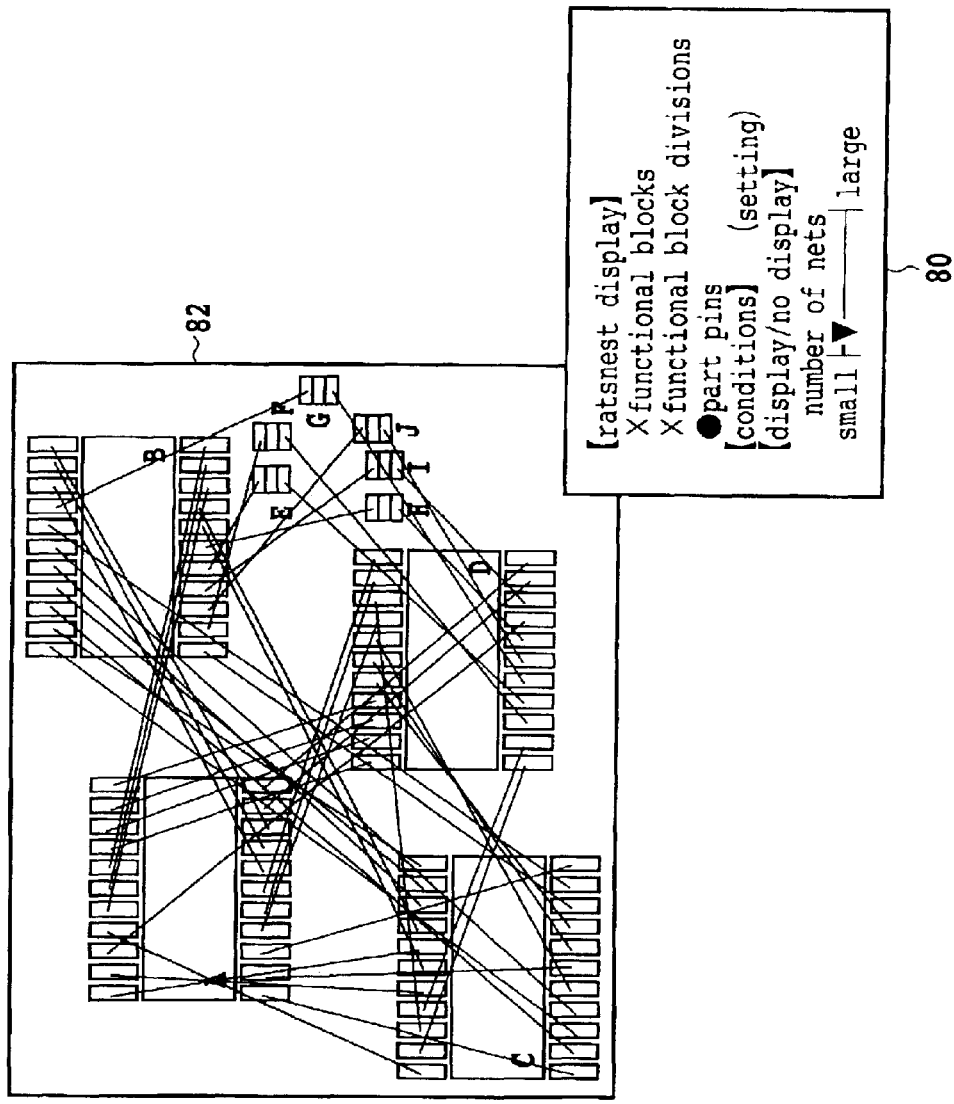

INTERACTIVE FLOOR PLANNER APPARATUS FOR CIRCUIT BLOCKS

BACKGROUND OF THE INVENTION

1. Field of the Invention

The present invention relates to an interactive floor planner apparatus, and particularly to an interactive floor planner apparatus having a ratsnest display function for use in designing arrangement and the like of a printed wiring board, a ceramic wiring board, or LSI functional blocks.

2. Description of the Related Art

Arrangement of parts to be packaged on a printed wiring board or a ceramic wiring board is designed with an interactive floor planner apparatus, as a CAD (Computer Aided Design) system. FIG. 13 is a diagram of a process of designing a printed wiring board. Circuitry of the printed wiring board is designed first. In designing the circuitry, an EDIF 2 in which parts realizing each functional block and information on logical connection between the parts are defined is created, and circuit operation is confirmed by simulation. In the logical connection information, a section where connection is required is defined as a group, and names of parts and pins required to be connected in the section are defined. Pin information, electrical specifications and the like of each of the parts are registered in a library 4.

For the packaging of parts on the wiring board, the board, part shape, land shape, line width, a number of layers, and other design specifications are defined in the library 4. On the basis of these pieces of data, a packaging design creating tool 6 creates a packaging design data file 8. The packaging design data file 8 refers to data required for the parts packaging design. In the packaging design process, editing, arrangement, wiring, checking and the like are performed with an interactive floor planner 10. Editing refers to the editing of signals, power supply, grounding lines, vias, lands, wide-area conductors, inhibited regions, marking and the like. Arrangement refers to arrangement of functional blocks on the board.

When the functional blocks are arranged, functional block information such as part names, arrangement coordinates, pin names, pin coordinates and the like of the functional blocks is written as part of the packaging design data file 8. Wiring refers to automatic or manual provision of wiring between pins of the functional blocks. Check refers to the checking of design rules such as line width, a line pitch and the like. On the basis of the packaging design data, a plan data file 14 is created with a general-purpose plan editing CAD system 12. In the meantime, the packaging design data file 8 is used to create NC data, mask data and the like, and the data is sent to a factory where the printed wiring board is fabricated.

In arranging a functional block in the arrangement process, connections between the functional block and another functional block are displayed as ratsnest for an optimum arrangement. The conventional interactive floor planner displays ratsnest in net units. Therefore, display of a plurality of nets becomes complicated, making it difficult to check connections between functional blocks. As in Japanese Patent Laid-Open No. Hei 8-137927, a system has been proposed which groups connecting relations between a plurality of parts by line type, line thickness, wiring color or the like and then displays the connecting relations, thereby making it possible for an operator to visually check the connecting relations between the plurality of parts easily and to thus reduce a design period.

However, the conventional interactive floor planner apparatus has the following problems. The method in Japanese Patent Laid-Open No. Hei 8-137927 groups only connecting relations between a plurality of parts and then displays the connecting relations; therefore, when a transmission functional block such as a resistance/buffer/switch or the like that is electrically passed through is connected between functional blocks, strength of connection between the functional blocks which connection is actually strong cannot be determined. In addition, in a case of a printed wiring board with a high density and a large number of functional blocks, grouping and displaying only connecting relations between parts makes it difficult to visually determine strength of the connections between the parts because of many display sections. Furthermore, in arranging functional blocks, for shorter net connection distance, the functional blocks need to be arranged with a direction of arrangement of the functional blocks in mind so as not to cause twists or the like. However, it is not possible to determine the direction of arrangement of the functional blocks with this display method, and it is consequently difficult to utilize the display method for consideration of the arrangement.

SUMMARY OF THE INVENTION

It is accordingly an object of the present invention to provide an interactive floor planner apparatus that makes it possible to visually determine strength of connection between parts.

In accordance with an aspect of the present invention, there is provided an interactive floor planner apparatus for determining a placement position of functional blocks, in which apparatus functional block information including information on pins and connection information on pin connection between the functional blocks are defined, the apparatus including: a functional block shape extracting unit for dividing each of the functional blocks into one or a plurality of parts on the basis of shape of the functional block obtained from the functional block information; an inter-functional block connection calculating unit for calculating a number of connections between pins belonging to parts of two functional blocks connected to each other, between the parts, as a number of connections between the parts on the basis of the connection information; and a ratsnest display unit for displaying the connections between the parts as a combined single line having a line width corresponding to the number of connections between the parts.

In accordance with another aspect of the present invention, there is provided an interactive floor planner apparatus wherein when connection between the parts of the two functional blocks is made via a transmission functional block having a predetermined function, the inter-functional block connection calculating unit calculates a number of connections between the parts connected via the transmission functional block, and the ratsnest display unit makes a display on the basis of the number of connections between the parts connected via the transmission block.

In accordance with a further aspect of the present invention, there is provided an interactive floor planner apparatus wherein the inter-functional block connection calculating unit calculates a number of connections between pins of the two functional blocks on the basis of the connection information, and when the two functional blocks are connected to each other via a transmission functional block having a predetermined function, the inter-functional block connection calculating unit calculates a number of connections between the functional blocks connected via the transmission functional block, and the ratsnest display unit displays the connection between the functional blocks on the basis of the number of connections between the functional blocks connected via the transmission block.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 3 is a diagram showing a data structure of a logical connection information unit in FIG. 2;

FIG. 4 is a diagram showing a data structure of a functional block information unit in FIG. 2;

FIG. 5 is a diagram showing a data structure of a ratsnest information unit in FIG. 2;

FIG. 6 is a diagram showing a display control panel;

FIG. 7A is a diagram illustrating a method of dividing a functional block;

FIG. 7B is a diagram illustrating a method of dividing a functional block;

FIG. 7C is a diagram illustrating a method of dividing a functional block;

FIG. 7D is a diagram illustrating a method of dividing a functional block;

FIG. 7E is a diagram illustrating a method of dividing a functional block;

FIG. 8 is a flowchart of ratsnest display;

FIG. 9 is a diagram showing an example of ratsnest display (part pins);

DESCRIPTION OF THE PREFERRED EMBODIMENTS

Figure 1:
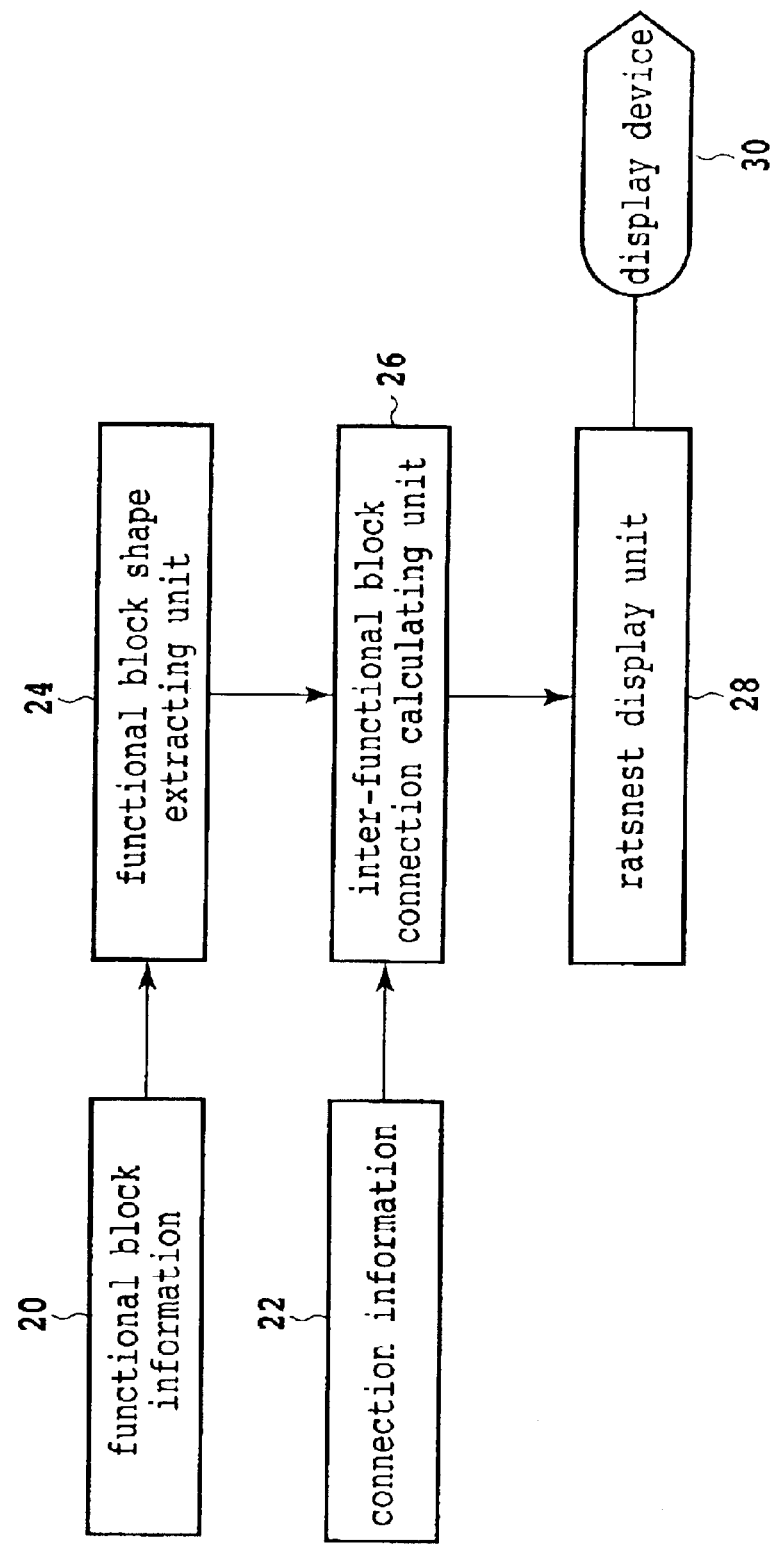
FIG. 1 is a diagram of assistance in explaining principles of the present invention.

Principles of the present invention will be described prior to description of preferred embodiments of the present invention. As shown in FIG. 1, an interactive floor planner apparatus includes a functional block shape extracting unit 24, an inter-functional block connection calculating unit 26, and a ratsnest display unit 28. In functional block information 20, information on pins and the like are defined. In connection information 22, information on pin connection between functional blocks is defined. The functional block shape extracting unit 24 divides each functional block into one or a plurality of parts on the basis of the shape of the functional block obtained from the functional block information 20. A part after the division will hereinafter be referred to as a divided piece. The inter-functional block connection calculating unit 26 calculates a number of connections between pins belonging to divided pieces of two functional blocks connected to each other, between the divided pieces, as a number of connections between the divided pieces on the basis of the connection information 22. The ratsnest display unit 28 displays the connections between the divided pieces on a display device 30 as a combined single line having a line width corresponding to the number of connections between the divided pieces. The connections between the functional blocks are thereby displayed according to the shape of the functional blocks, thus making it possible for an operator to easily conceive an arrangement that shortens connection paths through rotation of a functional block.

Figure 2:
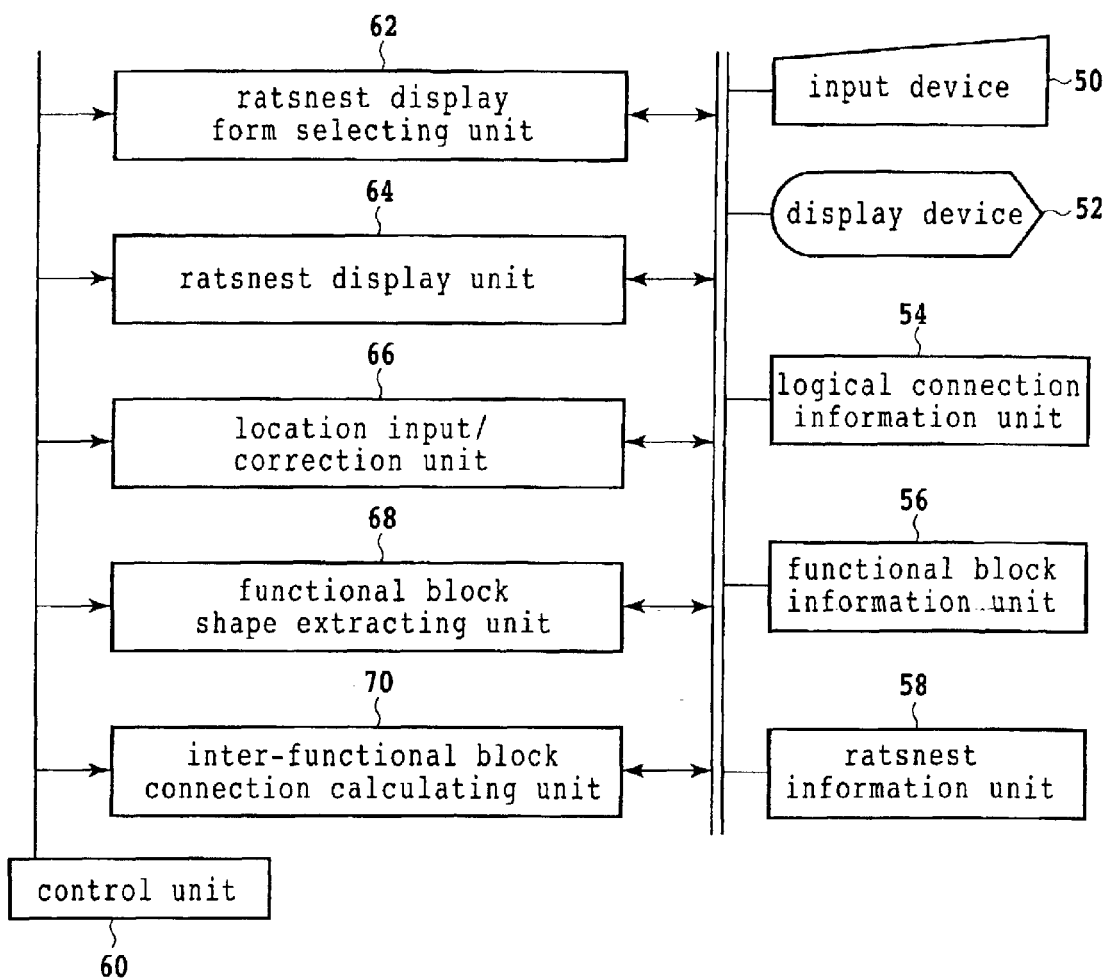
FIG. 2 is a block diagram of an interactive floor planner apparatus according to an embodiment of the present invention.

FIG. 2 is a block diagram of an interactive floor planner apparatus for display of ratsnest in block arrangement according to an embodiment of the present invention. As shown in FIG. 2, the interactive floor planner apparatus includes an input device 50, a display device 52, a logical connection information unit 54, a functional block information unit 56, a ratsnest information unit 58, a control unit 60, a ratsnest display form selecting unit 62, a ratsnest display unit 64, a location input/correction unit 66, a functional block shape extracting unit 68, and an inter-functional block connection calculating unit 70. The input device 50 is input means such as a keyboard, a mouse or the like. The display device 52 is a display for displaying characters, symbols and the like.

FIG. 3 is a diagram showing a data structure of the logical connection information unit 54 in FIG. 2. The logical connection information unit 54 is an output in a circuit design process which output indicates logical connections between functional blocks. As shown in FIG. 3, a section where connection is required is defined as one group, and each group is formed by a part name and a pin name of parts required to be connected in the section. For example, GROUP 2 in FIG. 3 is one group in which a first pin 1 of an IC1 part and a first pin 1 of a C10 part are required to be connected to each other.

FIG. 4 is a diagram showing a data structure of the functional block information unit 56 in FIG. 2. As shown in FIG. 4, the functional block information unit 56 includes a part name, location coordinates, a pin name, pin coordinates, pin information, a part symbol, a shape name and the like for each functional block. The part name is a part name of the functional block. The location coordinates are two-dimensional coordinates indicating a placement position of the functional block. When the functional block is not placed yet, coordinates generated in a process of packaging data generation are set.

The pin name is a designation of a pin possessed by the functional block. The pin coordinates are two-dimensional coordinates indicating a pin position of the pin name. The pin information is provided to recognize that part pins are connected to each other via a transmission functional block that can be passed through electrically. For example, when a first pin of IC1 is connected to a fourth pin of IC2 via a transmission functional block C10, a symbol indicating that the pins are connected to the same transmission functional block, for example α is set as the pin information. The part symbol denotes a type of part used for the functional block. For example, a part symbol C denotes a capacitor; a part symbol R denotes a resistance; a part symbol I denotes an IC; a part symbol CN denotes a connector; and a part symbol SW denotes a switch. The shape name indicates the shape of the part. For example, D denotes two directions; P denotes a PGA; A denotes axial; R denotes radial; Q denotes four directions; and E denotes others. In determining the shape of the part, two directions is denoted by "D" and four directions is denoted by "Q" or "P".

FIG. 5 is a diagram showing a data structure of the ratsnest information unit 58 in FIG. 2. The ratsnest information unit 58 stores information for ratsnest display, and includes, for each functional block, the functional block connected to a connecting position A, a connecting position B, a weight indicating a number of connections, and a transmission flag indicating connection via a transmission functional block. When ratsnest display is performed in functional block units, the connecting positions A and B are both the center of the functional blocks. When ratsnest display is performed in units of divided pieces of functional blocks, the connecting position A represents a position of a divided piece and the connecting position B represents a position of a divided piece of a functional block connected to the divided piece indicated by the connecting position A. The divided piece refers to a divided area obtained by dividing the functional block according to the shape of the functional block. For example, since a capacitor part C10 has two pins, a single divided piece is obtained and a central point of the part is the origin of the divided piece. Hence, a connecting point as the connecting position A of the part C10 is the center. When the capacitor part C10 is connected to an IC part of a part name IC1, and when IC1 is divided into an upper and a lower portion and C10 is connected to the lower divided piece of IC1, the connecting position B is the lower portion of IC1.

The weight indicates a number of connections between the connecting position A of a part name A and the connecting position B of a part name B. The weight is the number of connections or a result of addition of a value α corresponding to various conditions to the number of connections. In the present embodiment, α is zero. The transmission flag indicates whether or not the connecting position A of the part name A is connected to the connecting position B of the part name B via a transmission functional block. When 1 is set to the transmission flag, the transmission flag indicates that the connecting position A of the part name A is connected to the connecting position B of the part name B via a transmission functional block. For example, when three connections are made between the lower divided piece of IC1 and a right divided piece of IC2 via capacitors C10, C11, and C12, the part name B is IC2, the connecting position B is right, the weight is 3, and the transmission flag is 1 for the part name IC1 whose connecting position A indicates the lower divided piece.

The control unit 60 in FIG. 2 is a main control unit for controlling an interface of the ratsnest display form selecting unit 62 to the inter-functional block connection calculating unit 70. The ratsnest display form selecting unit 62 has the following functions.

(1) Displaying a menu on a display control panel 80 for control of ratsnest display on the display device 52. FIG. 6 is a diagram showing the display control panel 80. As shown in FIG. 6, the display control panel 80 is a menu screen for selecting a form of ratsnest display on the screen of the display device 52, and is formed by a menu of ratsnest display, conditions, and display/no display. The ratsnest display has a selection menu of functional blocks, functional block divisions, and part pins. The functional blocks is for selection for displaying connections between functional blocks. The functional block divisions is for selection for displaying connections between divided pieces of functional blocks. The part pins is for selection for displaying connections between part pins of functional blocks. The conditions represent a transmission condition, group color-coding, and a line width condition. The transmission condition indicates whether or not to display connections between functional blocks and a transmission functional block in addition to display of connections between the functional blocks when connections are made between the functional blocks via the transmission functional block. The display/no display specifies, by an arrow cursor, an arbitrary position between small and large which position is indicated as a number of nets (number of connections) by a condition of a lower limit on the number of connections between functional blocks in ratsnest display. The number of nets corresponding to small is 1. The number of nets corresponding to large may be a number of nets automatically calculated by the system (for example the maximum number of nets on the board), a default value of the system, or a value specified by a user. Alternatively, the number of nets may be directly specified by the user.

(2) Obtaining a ratsnest display form selected from the display control panel 80 by the operator using the input device 50.

The ratsnest display unit 64 refers to the ratsnest information unit 58, and displays a ratsnest according to the ratsnest display form obtained by the ratsnest display form selecting unit 62.

(i) When the part pins is selected in the ratsnest display, the ratsnest display unit 64 displays a ratsnest between pins of functional blocks.

(ii) When the functional blocks is selected and the weight exceeds the number of nets, ratsnests between the functional blocks are displayed as a combined single line with a line width corresponding to the weight.

(iii) When the functional block divisions is selected and the weight of the connecting point A of a divided piece of a functional block exceeds the number of nets, ratsnests connecting the connecting points A and B with each other are displayed as a combined single line with a line width corresponding to the weight.

The location input/correction unit 66 refers to the ratsnest information unit 58, and displays ratsnests of a functional block being moved on the screen of the display device 52 for location/relocation according to the ratsnest display form obtained by the ratsnest display form selecting unit 62 in a similar manner to that of the ratsnest display unit 64.

The functional block shape extracting unit 68 performs the following processing.

(1) Referring to the functional block information unit 56 and determining a dividing method on the basis of the shape of the functional block.

(2) Dividing the functional block into divided pieces by the dividing method.

FIGS. 7A, 7B, 7C, 7D, and 7E are diagrams illustrating dividing methods. Black circles in FIGS. 7A to 7E each denote a divided wire line origin, and broken lines each denote a dividing boundary line. Origins refer to connecting positions between functional blocks in ratsnest display.

(a) As shown in FIG. 7A, a one-pin or two-pin part is divided into one divided piece, and a central point of the part is set as an origin. The number of pins is determined from the pin name.

(b) As shown in FIG. 7B, when a part is provided with part pins in two directions, the part is divided into two divided pieces, that is, an upper and a lower divided piece divided in a direction of arrangement of the part pins with the center of the part serving as an origin. A part provided with part pins in two directions is determined from "D" used as the shape name.

(c) As shown in FIG. 7C, when a part is provided with part pins in four directions, the part is divided into four divided pieces, that is, an upper, a lower, a right, and a left divided piece divided by dividing boundary lines of diagonal lines connecting corners of the part to each other with the center point of the part serving as an origin. A part provided with part pins in four directions has "Q" or "P" used as the shape name thereof, for example.

(d) As shown in FIG. 7D, when a part has part pins therewithin and is of a square shape, the part is considered to be a rectangle, and is divided into four divided pieces, that is, an upper, a lower, a right, and a left divided piece divided along diagonal lines of the part. A square part is determined from the position of pin coordinates and outline coordinates of the functional block in a parts library which coordinates indicate that the part has part pins therewithin and is of a square shape.

(e) As shown in FIG. 7E, when a part is long in a vertical direction, the long sides of the part are divided into n pieces corresponding in number to the length of the long sides. A part long in a vertical direction is determined from outline coordinates of the functional block in the parts library or a part symbol indicating a connector, for example.

(3) Referring to the functional block information unit 56 and classifying pins of the functional block into the divided pieces.

For efficiency of processing, the above processing is performed for all functional blocks when the system is started, for example, and names of pins included in divided pieces of the functional blocks are stored in a file or the like.

The inter-functional block connection calculating unit 70 has the following functions.

(1) Referring to the logical connection information unit 54 for each functional block, calculating a number of connections of the connected functional block, and registering center as the connecting positions A and B, the number of connections as the weight, and 0 as the transmission flag in the ratsnest information unit 58.

(2) Referring to the logical connection information unit 54, calculating a number of connections to a divided area of a functional block directly connected to pins belonging to each divided piece of each functional block, which divided piece is obtained by the functional block shape extracting unit 68, and registering positions of the divided pieces in the functional blocks as the connecting positions A and B, the number of connections as the weight, and 0 as the transmission flag in the ratsnest information unit 58.

(3) Referring to the logical connection information unit 54, calculating a number of connections to a divided area of a functional block connected via through parts to pins belonging to each divided piece of each functional block, which divided piece is obtained by the functional block shape extracting unit 68, and registering positions of the divided pieces as the connecting positions A and B, the number of connections as the weight, and 1 as the transmission flag in the ratsnest information unit 58.

(4) Referring to the logical connection information unit 54, calculating a number of connections of a functional block connected via through parts to pins of each functional block, and registering center as the connecting positions A and B, the number of connections as the weight, and 1 as the transmission flag in the ratsnest information unit 58.

FIG. 8 is a flowchart of creation of the ratsnest information unit 58 and ratsnest display by the ratsnest display unit 64 and the ratsnest location input/correction unit 66. The ratsnest information unit 58 may be created in advance for all functional blocks when the system is started, for example, for efficiency of processing, or may be created when a ratsnest display form is selected by an operator from the display control panel 80. Description in the following will be made supposing that the ratsnest information unit 58 is created when a ratsnest display form is selected by an operator.

At a step S2, whether or not to divide functional blocks to be displayed is determined. When the functional blocks are to be divided, the processing proceeds to a step S4. When the functional blocks are not to be divided, the processing proceeds to a step S6. At the step S4, positions of block divided pieces of all functional blocks are set in the connecting position A of the ratsnest information unit 58 on the basis of the block divided pieces of the functional blocks divided by the functional block shape extracting unit 68.

At the step S6, when a pin to which a pin belonging to the connecting position A of each functional block registered in the ratsnest information unit 58 is connected is found on the basis of information of the logical connection information unit 54, it is determined which pin (connecting position B) of a part name B the pin is. When a table of a combination of the part name A, the connecting position A, the part name B, and the connecting position B is already present in the ratsnest information unit 58, 1 is added to the weight of the table. When there is no such table, the table is created and 1 is set as the weight of the table. When the functional blocks are not divided, center as the connecting position A for each block, the part name of a block connected to the block, center as the connecting position B, the number of connections, and a flag of 0 are registered in the ratsnest information unit 58.

At a step S8, whether or not there are transmission functional blocks is determined. A transmission functional block is a capacitor part, a buffer part, a resistance part, a connecter part or the like, and is determined from a part symbol (C, CN, R or the like) in the functional block information unit 56. When there are transmission functional blocks, the processing proceeds to a step S10. When there are no transmission functional blocks, the processing proceeds to a step S12.

At the step S10, on the basis of the information of the logical connection information unit 54, in a case of two functional blocks connected via transmission functional blocks and in a case of functional block division, one of the functional blocks as the part A, a position of a divided piece of the functional block as the connecting position A, the other functional block as the part B, a position of a divided piece of the functional block as the connecting position B, a number of connections connecting the connecting positions A and B directly/via the transmission functional blocks as the weight, and 1 as the transmission flag are registered in the ratsnest information unit 58. When the functional blocks are not divided and two functional blocks are connected via transmission functional blocks, one of the functional blocks as the part A, the center of the functional block as the connecting position A, the other functional block as the part B, the center of the functional block as the connecting position B, a number of connections connecting the connecting positions A and B directly/via the transmission functional blocks as the weight, and 1 as the transmission flag are registered in the ratsnest information unit 58.

At the step S12, a ratsnest for display is set on the basis of the ratsnest information unit 58 and the display control panel 80. When an instruction for functional block division is given, for example, a ratsnest connecting divided pieces of functional blocks at the connecting positions A and B of the divided pieces at an upper, a lower, a right, or a left portion or the like of the parts for display is to be displayed with a line width corresponding to the weight. When an instruction for the functional blocks is given, a ratsnest connecting centers of functional blocks corresponding to the connecting positions A and B of the parts for display is to be displayed with a line width corresponding to the weight. When an instruction not to display ratsnests for transmission functional blocks is issued, ratsnests connected directly to the transmission functional blocks are not to be displayed. In addition to the above conditions, when the number of nets is specified, or for example the number of nets is 3, a ratsnest whose weight in the ratsnest information unit 58 is more than 3 is to be displayed. Ratsnests for display are set according to other conditions such as color, line width, shape and the like. At a step S14, ratsnests are displayed on the display device 52.

Also when a functional block is being moved by location input/correction for the functional block, ratsnests are displayed according to the display control panel 80. At a step S16, whether the operator changes the display form from the display control panel 80 is determined. When the display form is to be changed, the processing returns to the step S2.

Operation of the interactive floor planner apparatus will be described in the following.

The logical connection information unit 54 and the functional block information unit 56 are created by a tool by referring to an EDIF, a parts and packaging library and the like, which are a product of circuit design for a printed wiring board. When the interactive floor planner is started, an operation for arranging functional blocks on the printed wiring board is started. The functional block shape extracting unit 68 determines the shape of each functional block from the number of pins, the part symbol, the shape name of the functional block, and pin position coordinates of the part in the parts library, and the like in the functional block information unit 56. The functional block shape extracting unit 68 then divides the functional block into divided pieces. The inter-functional block connection calculating unit 70 creates the ratsnest information unit 58 on the basis of the shape information from the functional block shape extracting unit 68 and the information of the functional block information unit 56 and the logical connection information unit 54. The ratsnest display unit 64 and the ratsnest location input/correction unit 66 display ratsnests as follows according to a ratsnest display form selected on the display control panel 80.

FIG. 9 shows an example of ratsnest display when part pins are selected. The board being designed and displayed on a display screen 82 of the display device 52 is mounted with four functional blocks (A, B, C, and D) formed by IC parts being arranged and six functional blocks (E, F, G, H, I, and J) formed by through parts such as a resistance, a capacitor, a switch or the like. As shown in FIG. 9, ratsnests showing connections between pins of the IC parts A to D and the through parts E to J are displayed on the display screen 82 of the display device 52.

Figure 10:
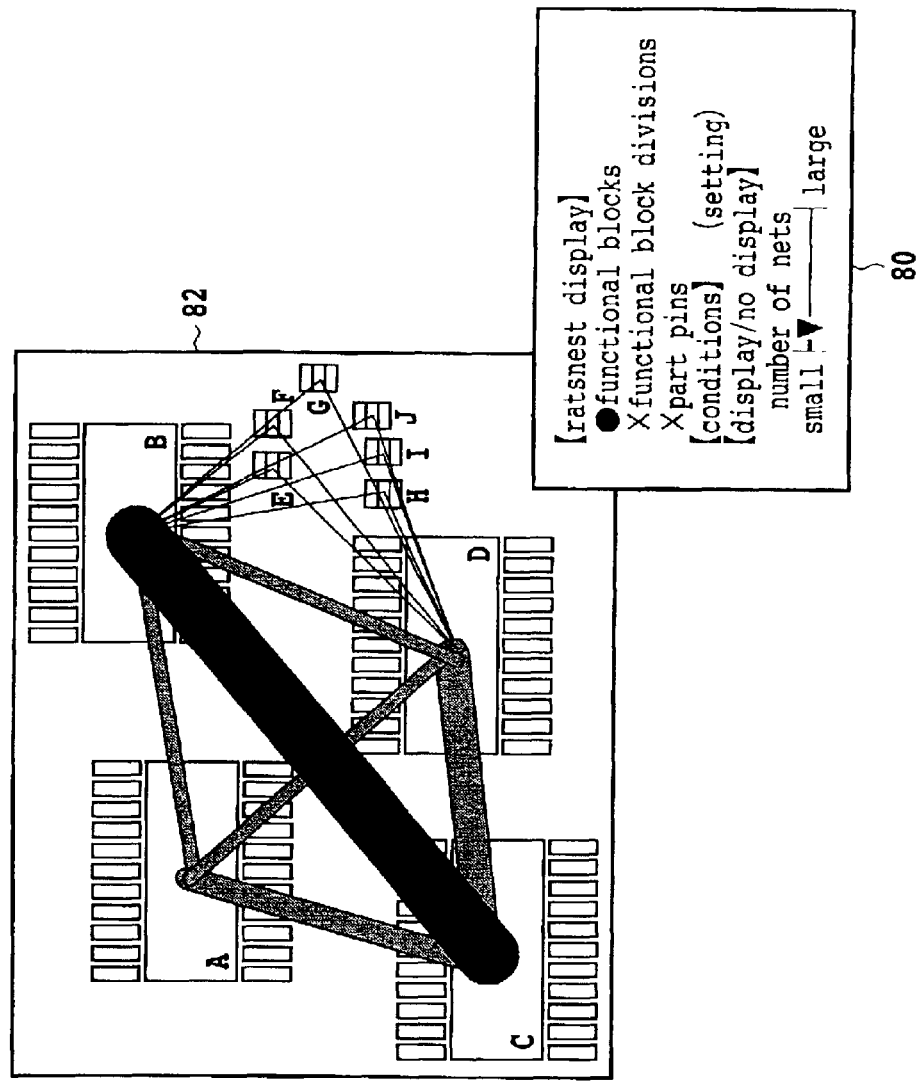
FIG. 10 is a diagram showing an example of ratsnest display (functional blocks)

FIG. 10 shows an example of ratsnest display when functional blocks are selected. Connections between part pins are the same as those of FIG. 9. The ratsnest display unit 64 combines ratsnests into a single line on the basis of the weight of connection between the blocks for display stored in the ratsnest information unit 58, and thereby displays a ratsnest with a line width proportional to the weight on the display screen 82 of the display device 52. Only ratsnests with a weight exceeding the number of nets specified on the display control panel 80 are displayed.

Thus, as shown in FIG. 10, ratsnests displayed from functional block pins in net units are displayed as a single ratsnest between one functional block and another functional block. As to transmission functional blocks, ratsnests between two functional blocks connected via transmission functional blocks are displayed as a combined single line with a line width proportional to a number of connections obtained by adding a number of connections via the transmission blocks between the two functional blocks to a number of direct connections between the two functional blocks. In this case, when setting is made so as not to display transmission functional blocks, ratsnests between functional blocks via the transmission functional blocks are displayed. For example, since connection between the functional blocks B and D is made via the transmission blocks E, F, G, H, I, and J, ratsnests between the functional blocks B and D are displayed as a combined single line, as shown in FIG. 10. It is thus possible to easily perceive strength of connection between functional blocks.

Figure 11:
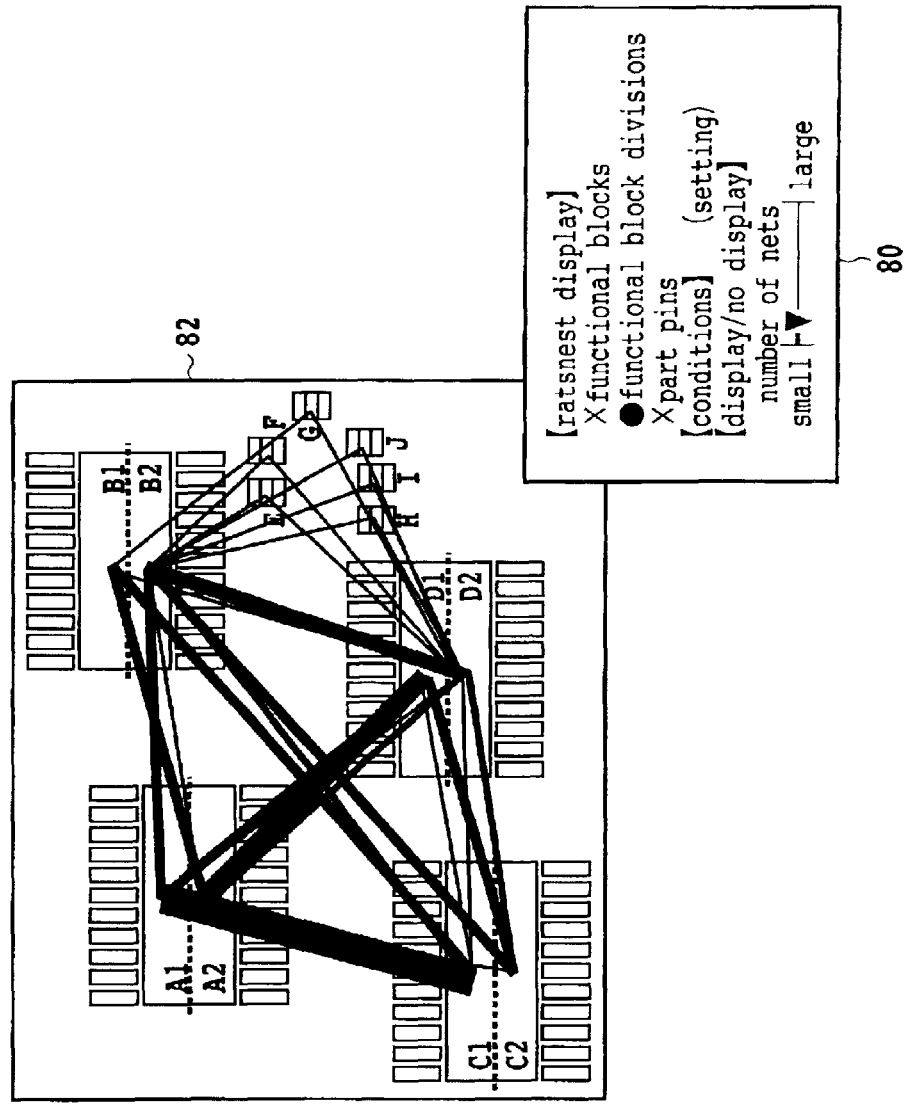
FIG. 11 is a diagram showing an example of ratsnest display (functional block divisions)

FIG. 11 shows an example of ratsnest display when functional block division is selected. Connections between part pins are the same as those of FIG. 9. The ratsnest display unit 64 combines ratsnests into a single line on the basis of the weight of connection between the divided pieces after division of blocks for display stored in the ratsnest information unit 58, and thereby displays a ratsnest with a line width proportional to the weight on the display screen 82 of the display device 52. Only ratsnests with a weight exceeding the number of nets specified on the display control panel 80 are displayed. Thus, as shown in FIG. 11, ratsnests displayed from functional block pins in net units are displayed as a single line ratsnest between one functional block divided piece and another functional block divided piece. It is thereby possible to easily conceive an arrangement that shortens connection paths through rotation of a functional block.

As to transmission functional blocks, ratsnests between two functional block divided pieces connected via transmission functional blocks are displayed as a combined single line with a line width proportional to a number of connections obtained by adding a number of connections via the transmission blocks between the two functional block divided pieces to a number of direct connections between the two functional block divided pieces. In this case, when setting is made so as not to display transmission functional blocks, ratsnests between functional block divided pieces via the transmission functional blocks are displayed. For example, since the parts of the functional blocks A, B, C, and D are each provided with part pins in two directions, the functional blocks A, B, C, and D are each divided into two functional block divided pieces, that is, the functional blocks A, B, C, and D are divided into functional block divided pieces A1, A2, B1, B2, C1, C2, D1, and D2. A ratsnest between divided pieces is then displayed with a line width corresponding to the number of connections between the divided pieces. It is thus possible to easily perceive strength of connection between functional block divided pieces.

Figure 12:
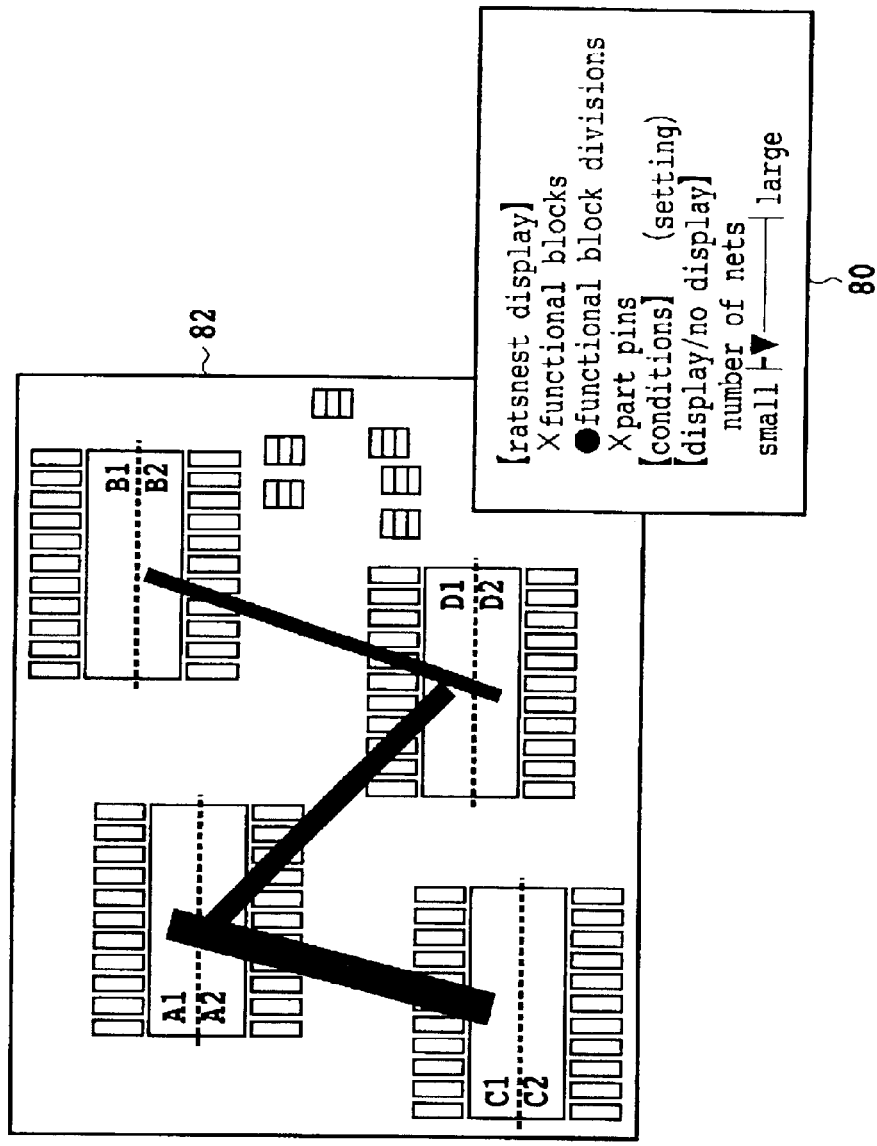
FIG. 12 is a diagram showing an example of ratsnest display (number of nets)
Figure 13:
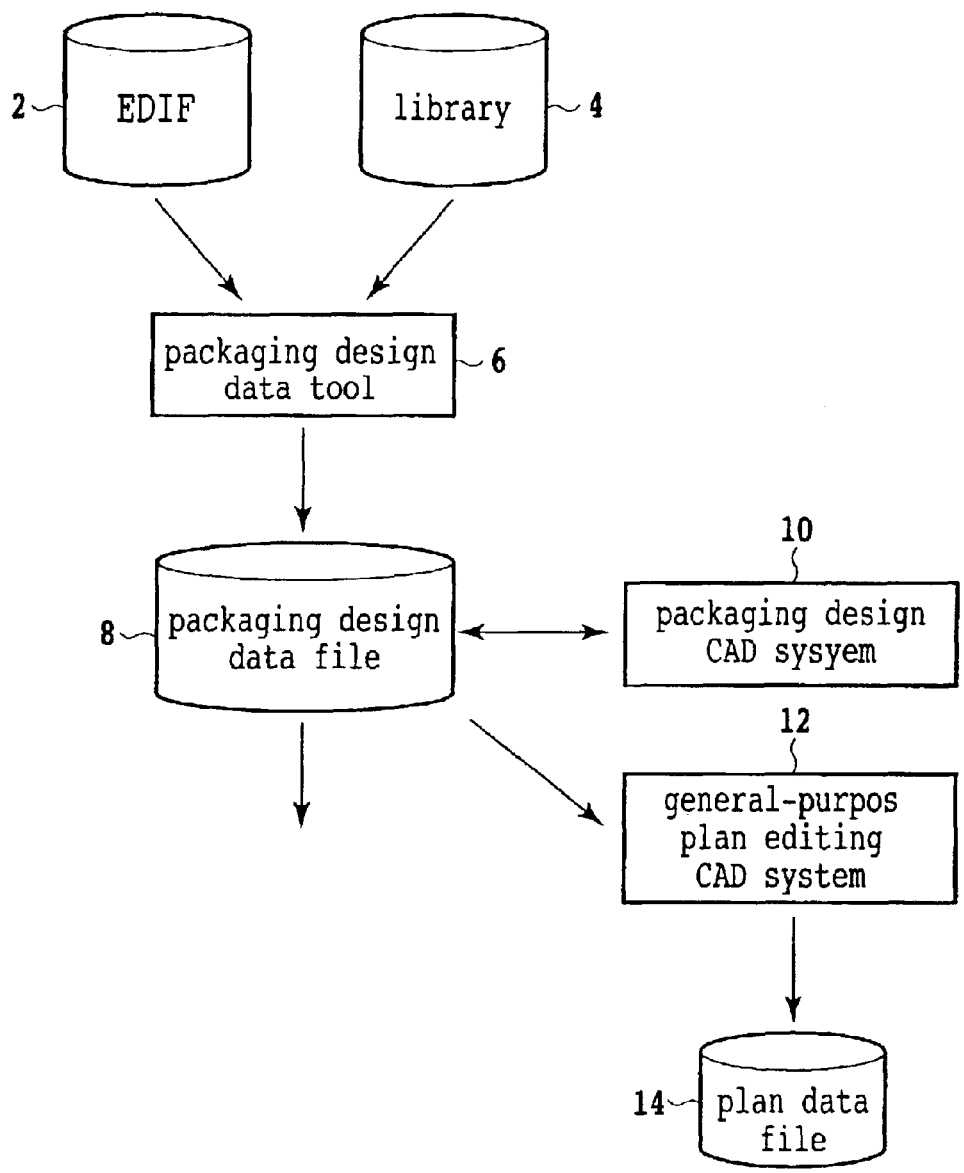
FIG. 13 is a diagram of a process of designing a printed wiring board.

FIG. 12 shows an example of ratsnest display when the number of nets is set and functional block division is selected. Connections between part pins are the same as those of FIG. 9. As shown in FIG. 12, the ratsnest display unit 64 displays only ratsnests in which the number of connections between divided pieces of functional blocks exceeds the number of nets, and does not display the other ratsnests. Therefore, as shown in FIG. 12, display limitation can be set by the number of nets connected between functional blocks. It is thus possible to display only strong connections, and thereby facilitate intuitive perception and arrangement of functional blocks with a large number of nets connected therebetween.

According to the present invention described above, connection between one functional block and another functional block is represented by a single ratsnest, and therefore the connection between the functional blocks can be perceived at a glance even when all nets are displayed on the screen. In the case of functional block division, a functional block is divided into parts according to configuration of the functional block, and ratsnests of the parts are displayed. It is thereby possible to easily conceive an arrangement that shortens connection paths through rotation of a functional block. In addition, the number of nets connected between functional blocks is represented by line width/color/shape of a ratsnest. It is therefore possible to easily perceive strength of connection between the functional blocks. Furthermore, display limitation can be set by the number of nets connected between functional blocks. It is thus possible to display only strong connections, and thereby facilitate intuitive perception and arrangement of functional blocks with a large number of nets connected therebetween.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An interactive floor planner apparatus for determining a placement position of functional blocks, in which apparatus functional block information including information on pins and connection information on pin connection between the functional blocks are defined, said apparatus comprising:

a functional block shape extracting unit for dividing each of said functional blocks into one or a plurality of parts on the basis of shape of the functional block obtained from said functional block information;

an inter-functional block connection calculating unit for calculating a number of connections between pins belonging to parts of two functional blocks connected to each other, between the parts, as a number of connections between the parts on the basis of said connection information; and a ratsnest display unit for displaying the connections between said parts as a combined single line having a line width corresponding to the number of connections between said parts.

2. An interactive floor planner apparatus as claimed in claim 1, wherein when connection between the parts of the two functional blocks is made via a transmission functional block having a predetermined function, said inter-functional block connection calculating unit calculates a number of connections between the parts connected via said transmission functional block, and said ratsnest display unit makes a display on the basis of the number of connections between the parts connected via said transmission block.

3. An interactive floor planner apparatus as claimed in claim 2, wherein said inter-functional block connection calculating unit calculates a number of connections between pins of the two functional blocks on the basis of said connection information, and when the two functional blocks are connected to each other via a transmission functional block having a predetermined function, said inter-functional block connection calculating unit calculates a number of connections between the functional blocks connected via said transmission functional block, and said ratsnest display unit displays the connections between said functional blocks on the basis of the number of connections between said functional blocks connected via said transmission block.

4. An interactive floor planner apparatus as claimed in claim 3, further including a ratsnest display form selecting unit for displaying, on a screen, a panel control screen for prompting an operator to select one of forms of display in units of a functional block, units of a functional block division, and units of a pin for ratsnest display, and obtaining a form of display selected by the operator, wherein said ratsnest display unit displays a ratsnest on the basis of the form of display obtained by said ratsnest display form selecting unit.

5. An interactive floor planner apparatus as claimed in claim 3, wherein said ratsnest display unit displays a ratsnest in which the number of connections between the blocks or the parts exceeds a predetermined number.

6. An interactive floor planner apparatus as claimed in claim 1, further including a placement and location correction unit for displaying the connections between said parts of the functional blocks being moved in a placement area for placement or location correction as the combined single line having the line width corresponding to the number of connections between said parts.

7. An interactive floor planner apparatus as claimed in claim 1, wherein said functional block information includes a part symbol for identifying a transmission functional block, a shape symbol for shape of said functional block, and positional information on said pins, and said functional block shape extracting unit divides said functional blocks into parts on the basis of said functional block information of said functional blocks.

8. An interactive floor planner apparatus as claimed in claim 1, wherein when a part forming said functional block is a one-pin or two-pin part, said functional block shape extracting unit divides the part into one piece with a center of the part as an origin; when the part is provided with pins in four directions, that is, on a right, a left, an upper, and a lower side, said functional block shape extracting unit divides the part into four pieces, that is, an upper, a lower, a right, and a left piece with a central point of the part as an origin; when the part is provided with part pins in two directions, said functional block shape extracting unit divides the part into two pieces, that is, an upper and a lower piece with a center of the part as an origin; when the part is long in a vertical direction, said functional block shape extracting unit divides opposed long sides of the part into n pieces ($n \geq 2$); and when the part has part pins therewithin and is of a square shape, said functional block shape extracting unit divides the part into four pieces at right angles with a central point of the part as an origin.

* * * * *